United States Patent
Drobny et al.

(10) Patent No.: US 8,053,322 B2
(45) Date of Patent: Nov. 8, 2011

(54) EPITAXIAL DEPOSITION-BASED PROCESSES FOR REDUCING GATE DIELECTRIC THINNING AT TRENCH EDGES AND INTEGRATED CIRCUITS THEREFROM

(75) Inventors: Vladimir F. Drobny, Tucson, AZ (US); Amitava Chatterjee, Plano, TX (US); Phillipp Steinmann, Richardson, TX (US); Rick Wise, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 120 days.

(21) Appl. No.: 12/344,995

(22) Filed: Dec. 29, 2008

(65) Prior Publication Data

US 2010/0163997 A1 Jul. 1, 2010

(51) Int. Cl.
*H01L 21/336* (2006.01)

(52) U.S. Cl. .................. 438/296; 438/770; 257/E21.55; 257/E21.301

(58) Field of Classification Search .................. 438/222, 438/296, 770, 442, 431, 424, 425; 257/E21.55, 257/E21.552, E21.551, E21.628, E21.546, 257/E21.675, E21.686, E21.301, E27.06, 257/E29.264
See application file for complete search history.

(56) References Cited

U.S. PATENT DOCUMENTS

| | | | | |
|---|---|---|---|---|
| 7,091,104 B2* | 8/2006 | Kim et al. | ...................... | 438/424 |
| 7,105,399 B1* | 9/2006 | Dakshina-Murthy et al. | .............................. | 438/221 |
| 2004/0145020 A1* | 7/2004 | Kang et al. | ..................... | 257/350 |
| 2006/0001108 A1* | 1/2006 | Yamamoto | ..................... | 257/395 |
| 2006/0030136 A1* | 2/2006 | Chen | .............................. | 438/585 |
| 2006/0264007 A1* | 11/2006 | Lee et al. | ....................... | 438/478 |
| 2008/0142881 A1* | 6/2008 | Mikasa | ......................... | 257/330 |
| 2008/0160768 A1* | 7/2008 | Ni et al. | ......................... | 438/703 |
| 2009/0146263 A1* | 6/2009 | Chen et al. | ..................... | 257/627 |
| 2011/0095341 A1* | 4/2011 | Pal et al. | ........................ | 257/288 |

* cited by examiner

*Primary Examiner* — Matthew Landau
*Assistant Examiner* — Latanya N Crawford
(74) *Attorney, Agent, or Firm* — Warren L. Franz; Wade J. Brady, III; Frederick J. Telecky, Jr.

(57) ABSTRACT

A method of fabricating an integrated circuit (IC) and ICs therefrom including a plurality of Metal Oxide Semiconductor (MOS) transistors having reduced gate dielectric thinning and corner sharpening at the trench isolation/semiconductor edge for gate dielectric layers generally 500 to 5,000 Angstroms thick. The method includes providing a substrate having a silicon including surface. A plurality of dielectric filled trench isolation regions are formed in the substrate. The silicon including surface forms trench isolation active area edges along its periphery with the trench isolation regions. An epitaxial silicon comprising layer is deposited, wherein the epitaxial comprising silicon layer is formed over the silicon comprising surface. The epitaxial comprising silicon layer is oxidized to convert at least a portion into a thermally grown silicon oxide layer, wherein the thermally grown silicon oxide layer provides at least a portion of a gate dielectric layer for at least one of said plurality of MOS transistors. A patterned gate electrode layer is formed over the gate dielectric, wherein the patterned gate electrode layer extends over at least one of the trench isolation active area edges. Fabrication of the IC is then completed.

21 Claims, 4 Drawing Sheets

EPITAXIAL DEPOSITION-BASED PROCESSES FOR REDUCING GATE DIELECTRIC THINNING AT TRENCH EDGES AND INTEGRATED CIRCUITS THEREFROM

FIELD OF THE INVENTION

Embodiments of the present invention relate to methods of manufacturing integrated circuits (ICs) and in particular to methods of manufacturing Metal Oxide Semiconductor (MOS) field effect transistors (FETs) having trench isolation, and ICs therefrom that reduce thermally grown gate dielectric thinning at the trench/active area edge/corner.

BACKGROUND

One common isolation technique for electrically isolating transistors is based on trench isolation. The trench isolation process is generally more suitable for semiconductor chips having high packing density, as compared to local oxidation (LOCOS) processing. A trench region is formed in conventional semiconductor substrates (e.g. Si) with a depth deep enough for isolating the devices or different wells. In general, trenches are etched using a patterned hard mask material (e.g. silicon nitride) over a pad oxide for masking the active area. A thin liner oxide is generally thermally grown and the trenches are then refilled with a deposited dielectric material, such as deposited using a high-density plasma chemical vapor deposition (HDP-CVD) process.

As used herein, the term "trench isolation" applies for both conventional (e.g. bulk Si) substrates as well as silicon-on-insulator (SOI) substrates. Applied to conventional substrates, as used herein, trench isolation includes deep trench isolation which is typically 1-5 µm deep, and shallow trench isolation which is typically <1 µm deep, such as 0.3 to 0.7 µm deep. Applied to SOI substrates, as used herein, trench isolation includes the isolation regions between the active area islands. In the case of thin film SOI substrates, the trench isolation regions as in the conventional substrate case are generally filled with a deposited dielectric, but are typically shallower than their conventional substrate counterparts, being generally <0.5 µm deep, such as 0.01 to 0.3 µm deep.

Typically, after the trench isolation process is completed, the pad oxide (if present) is removed and a gate oxide is thermally grown on the active area. Sometimes a sacrificial (dummy) gate oxide is grown and stripped prior to the final gate oxide growth.

As known in the art, thermally grown gate oxide thinning occurs at the trench isolation/active area edge (or corner) when the gate oxide thickness is at least several hundred Angstroms or more. Such thinning results from the reduced diffusion controlled (parabolic) oxidation rate at the mechanically stressed relatively sharp trench isolation edge relative to gate oxide grown in the active area away from the trench isolation edge. Although steam oxidation, higher temperature, and high pressure oxidation can prevent or at least reduce thinning at the trench isolation edge if target thickness is relatively small by extending the linear oxidation regime, such as up to about 300 to 475 Angstroms, the thicker gate oxides needed for high voltage transistors, such as from 1,000 to 5,000 Angstroms thick (e.g. for max Vg of 75 V to 200 V), result in significant thinning at the trench isolation edge which can result in yield loss or reliability problems. Typically, the gate oxide thickness at the trench isolation edge is ≦75% of the gate oxide thickness in the active area away from the trench isolation edge. Accordingly, it is desirable to provide methods for fabricating an IC in which a relatively thick gate oxide, such as 500 to 5,000 Angstroms thick, can be grown with reduced or eliminated gate oxide thinning relative to the gate oxide thickness grown in the active area away from the trench isolation edge.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

Embodiments of the present invention describe methods for fabricating integrated circuits (IC) and ICs therefrom including a plurality of trench isolated Metal Oxide Semiconductor (MOS) transistors having reduced gate dielectric thinning and corner sharpening at the trench isolation/semiconductor edge. In certain embodiments of the invention, in the case of a silicon comprising semiconductor layer, an epitaxial silicon layer is deposited preceding the gate oxidation step for forming a thermally grown gate oxide layer that is ≧500 Angstroms thick.

The epitaxial silicon layer is thermally oxidized to form a thermally grown silicon oxide layer that comprises at least part of the gate dielectric layer. The epitaxial silicon layer can be a selective epitaxial layer, a non-selective epitaxial layer, or a first portion being selective and a second portion being non-selective. In a typical embodiment of the invention a thickness of the thermally grown silicon oxide comprising gate dielectric layer over the trench isolation active area edges is at least 95% of a thickness of the gate dielectric layer over the active silicon comprising surface 0.3 µm away from the trench isolation active area edges. A thickness of the gate dielectric over the silicon comprising surface away from the trench isolation active area edge is generally from 500 to 5,000 Angstroms thick.

DETAILED DESCRIPTION

Figure 1:
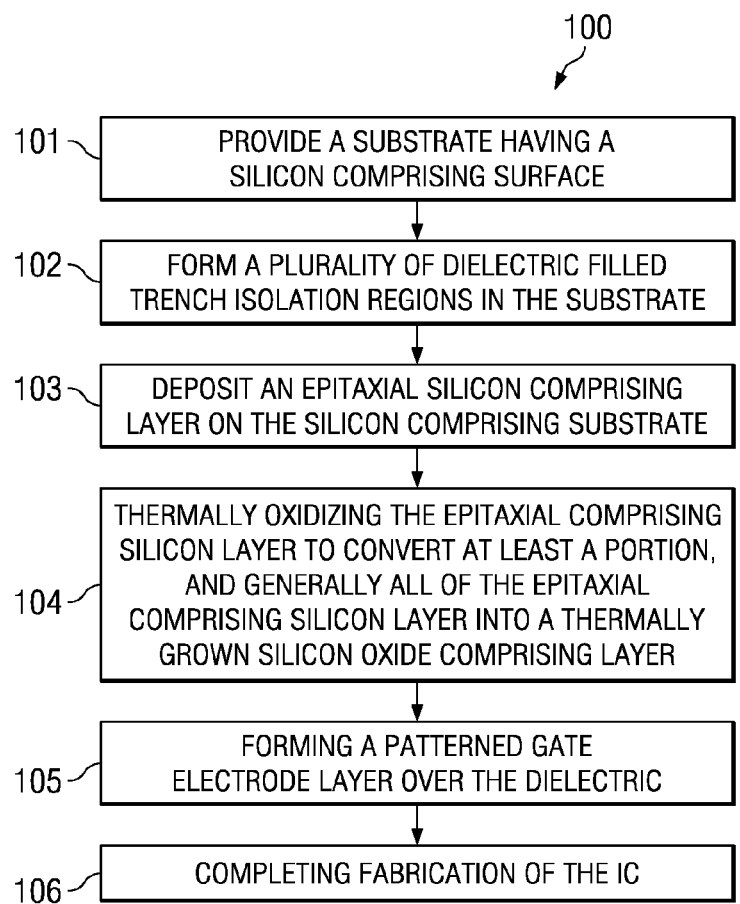
FIG. 1 shows a process flow for an exemplary method of fabricating an IC including a plurality of MOS transistors that have reduced gate dielectric thinning at the trench edges/corners, according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the invention describe methods for fabricating ICs including a plurality of trench isolated MOS transistors having reduced or eliminated gate dielectric thinning and corner sharpening at the trench isolation/active area edge. In certain embodiments of the invention, in the case of a substrate having a silicon comprising semiconductor layer, an epitaxial silicon layer is deposited preceding the gate oxidation step.

FIG. 1 shows an exemplary method 100 of fabricating an integrated circuit (IC) including a plurality of MOS transistors that have reduced or eliminated gate dielectric thinning and corner sharpening at the trench edges, according to an embodiment of the invention. In step 101, a substrate having a silicon comprising surface is provided. The substrate can comprise Si or Si/Ge, for example.

In step 102, a plurality of dielectric filled trench isolation regions are formed in the substrate, wherein the silicon comprising surface forms trench isolation active area edges along its periphery with the trench isolation regions. In one embodiment, the dielectric in the trench can comprise a plasma enhanced deposited silicon oxide layer. In another embodiment of the invention, step 102 comprises a divot reduction technique such as a nitride (or more generally hard mask layer) pullback process for reducing the depth of the divot that results from the conventional pre-gate oxide clean process. As known in the art, by recessing the patterned hard mask layer (e.g. nitride) from the trench edge, the deposited and/or grown trench dielectrics will better protect the trench edge from a pre-gate oxide clean process and result in divot reduction.

An epitaxial silicon comprising layer is then deposited in step 103, wherein an epitaxial comprising silicon layer (e.g. single crystal silicon layer) is formed over the silicon comprising surface. The epitaxial layer is also formed over the trench isolation active area edges generally at least 300 Angstroms laterally into the dielectric filled trench isolation regions, whether the epitaxial deposition process is selective, non-selective, or selective then non-selective, as described below. The epitaxially deposited silicon also fills the trench isolation divot that may be present.

As a result of the epitaxial silicon growth on the trench isolation active area edges, during the subsequent gate oxidation step 104 described below, the silicon comprising surface will oxidize more homogeneously than otherwise possible due to the absence of an exposed trench isolation corner. The epitaxial layer will generally follow the crystal orientation of the underlying silicon comprising surface, and result in a generally high quality (low defect density) single crystal layer.

As noted above, the epitaxial silicon process can be either non-selective, selective or a combination of both. As known in the art, selectivity in an epitaxial silicon deposition process is primarily controlled by the addition of chlorine, generally either from the addition of HCl gas or from the use of a chlorinated silicon gas for the epitaxial deposition, such as dichlorosilane or trichlorosilane. HCl is generally used even if a chlorinated silicon source is used because it gives an additional degree of freedom. Selectivity generally requires that the silicon etch rate exceeds the silicon nucleation and growth rate on the trench dielectric surface. The selective/non-selective combined process generally comprises a first deposition comprising a selective epitaxial deposition portion and a second deposition after the first deposition comprising a non-selective epitaxial deposition portion.

In step 104 the epitaxial comprising silicon layer is oxidized to convert at least a portion, and generally all of the epitaxial comprising silicon layer into a thermally grown silicon oxide comprising layer. In the case of non-selective epitaxial deposition, the polysilicon formed on the trench isolation surface is also oxidized in step 104. The thermally grown silicon oxide layer will primarily comprise (i.e. provide at least 50%) the thickness of the gate oxide layer, and in one embodiment the entire thickness of the gate dielectric layer for at least one of the plurality of MOS transistors.

Figure 2A:
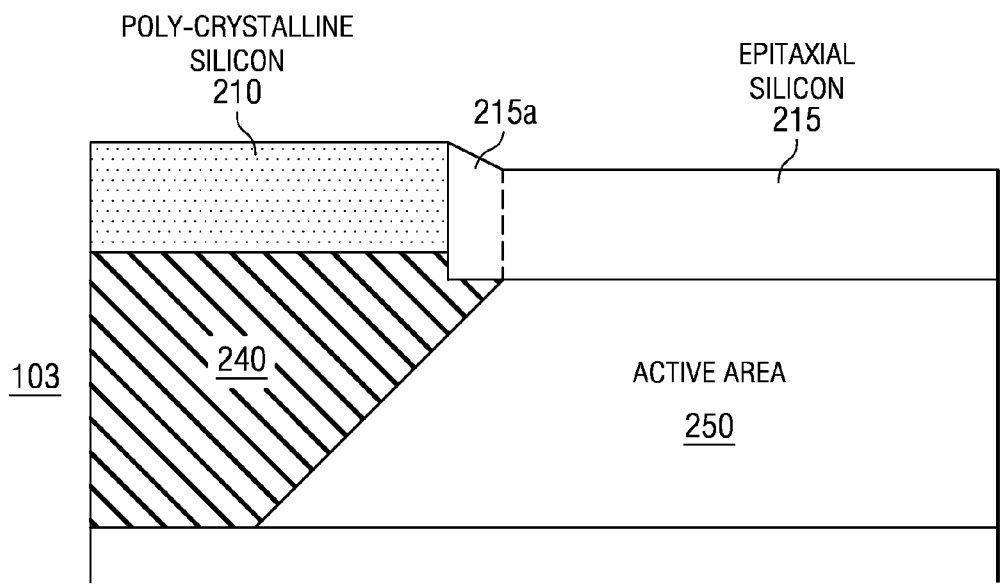
FIGS. 2A-B show cross-sectional depictions of resulting structures following an epitaxial silicon deposition step and a thermal gate oxidation step described relative to FIG. 1 for a non-selective epitaxial silicon deposition process, respectively, according to another embodiment of the invention.
Figure 2B:
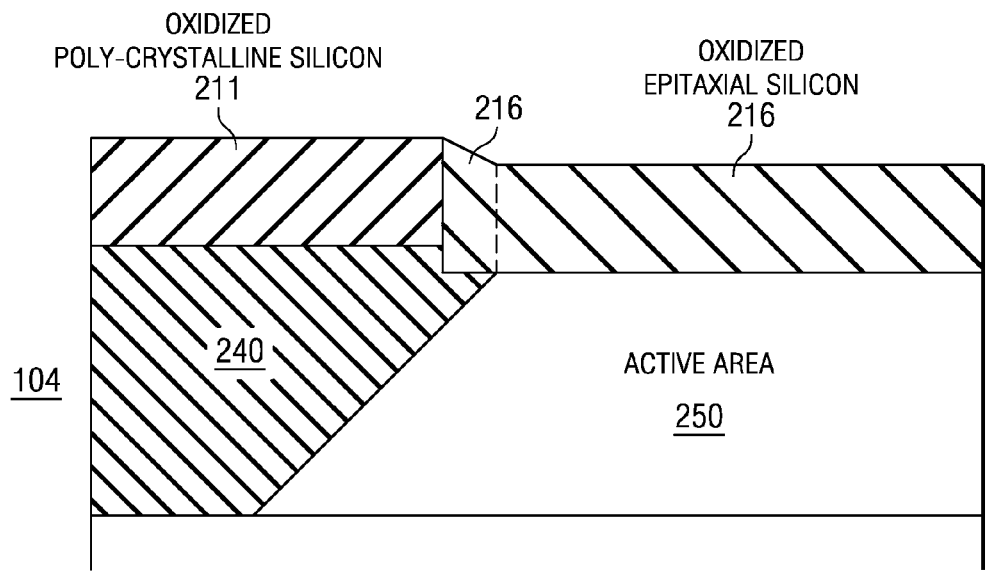

FIGS. 2A and 2B show cross-sectional depictions of resulting structures following the epitaxial silicon deposition step 103 and thermal gate oxidation step 104, respectively, for a non-selective epitaxial silicon deposition processes, according to another embodiment of the invention. Referring to FIG. 2A, a polycrystalline silicon layer 210 is deposited on the surface of the dielectric filled trench isolation region 240 while an epitaxial silicon layer 215 is deposited over the silicon comprising active area 250 and over the trench isolation 240/active area 250 edges in the region identified as 215a which generally extends at least 300 Angstroms laterally into the trench isolation region 240. As described above, the thicknesses of the polycrystalline silicon layer 210 and the epitaxial silicon layer 215 are generally within 5% of one another. As shown in FIG. 2B, following thermal oxidation at step 104, polycrystalline silicon layer 210 and epitaxial silicon layer 215 are both generally fully oxidized to form oxidized polysilicon layer 211 over the trench isolation region 240 and oxidized epitaxial silicon layer 216 over the active area 250 and also over a portion of the isolation region 240 corresponding to region 215a shown in FIG. 2A.

For the non-selective deposition embodiment, the thicknesses of the polysilicon/epitaxial layers 215/210 are generally ≦about 30%-50% of the desired gate oxide thickness so that the thermal gate oxidation step 104 consumes the full thickness of the polysilicon layer 210 over the trench isolation regions 240, thus avoiding residual polysilicon. Fully oxidizing polysilicon layer 210 over the trench isolation regions 240 eliminates a polysilicon connection path between adjacent active areas, thereby maintaining the lateral isolation provided by the trench isolation. In one particular embodiment, a thickness of the silicon oxide layer over the silicon comprising surface away from the trench isolation/active area edges is from 500 to 5,000 Angstroms, and a thickness of the epitaxial silicon comprising layer as deposited is from 25 to 55% of the thickness of the thermally grown silicon oxide layer.

Figure 2C:
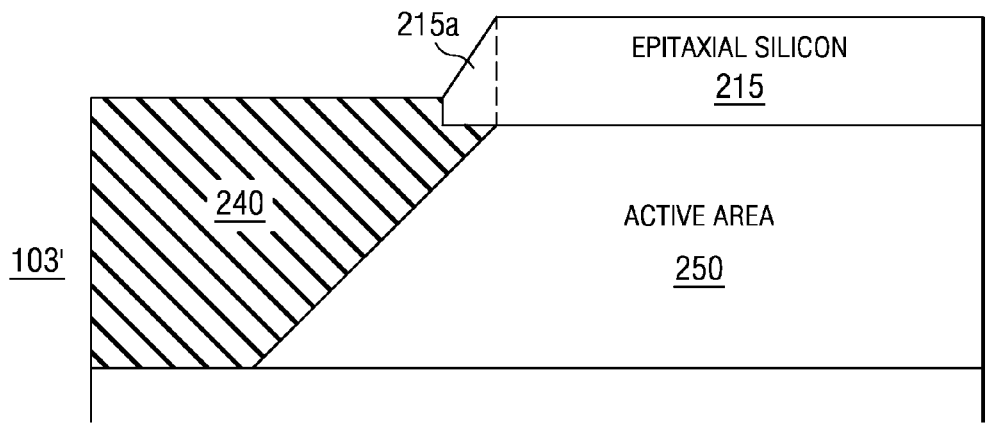
FIGS. 2C-D show cross-sectional depictions of resulting structures following the epitaxial silicon deposition step and thermal gate oxidation step described relative to FIG. 1 for a selective epitaxial silicon deposition process, respectively, according to another embodiment of the invention.
Figure 2D:
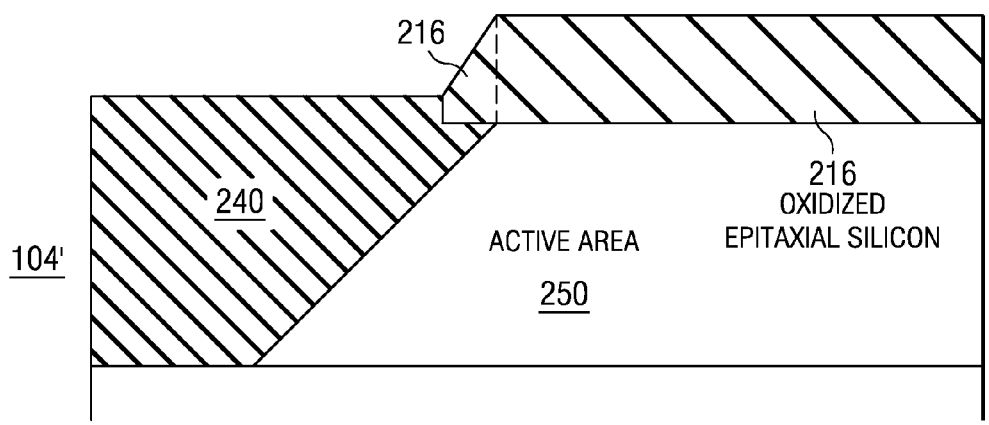

FIG. 2C-D show cross sectional depictions of resulting structures following the epitaxial silicon deposition step and thermal gate oxidation step described relative to FIG. 1 for a selective epitaxial silicon deposition process, respectively, according to another embodiment of the invention. As shown in FIG. 2C, step 103' deposits epitaxial silicon layer 215 over the active area 250 and over the trench isolation 240/active area 250 edge in the region identified as 215a which as noted above generally extends at least 300 Angstroms laterally into the dielectric filled trench isolation region 240. As shown in FIG. 2D, following step 104' the epitaxial silicon layer 215 is shown fully oxidized to form oxidized epitaxial silicon layer 216. There is generally no requirement that following step 104' epitaxial silicon layer 215 is fully oxidized. As shown in FIG. 2D, the selective epitaxy process also smoothes out the trench edge significantly. As will be recognized by one having ordinary skill in the art, a certain amount of selectivity can be advantageous in a dual gate process (having high voltage thick gate dielectric devices and lower voltage thin gate dielectric devices) to reduce the topology after the first gate dielectric removal.

As known in the art, thermally grown silicon oxide comprising layers are distinguishable as compared to deposited silicon oxide comprising layers. In addition, since deposited dielectrics are generally deposited at significantly lower temperatures as compared to thermal oxides, deposited dielectrics general exhibit structural inferiority resulting in higher leakage currents and lower breakdown strengths, even if later densified at high temperature. Another way to distinguish thermal and deposited silicon oxide layers is by reference to stoichiometry. Thermal oxides are essentially stoichiometric, such as almost exactly $SiO_2$, wherein deposited oxides tend to be silicon rich, and thus represented by $SiO_{2-x}$, where x is generally 0.02 to 0.70.

Exemplary data evidencing formation of silicon rich deposited silicon oxides presented as Si-excess (in atomic %) as a function of the precursor gas flow ratio (R) for the precursors nitrous oxide to silane is shown in the Table below. This data was obtained from M. Riera et al. "Modeling of non-stoichiometric silicon oxides obtained by plasma enhanced chemical vapour deposition process" Thin Solid Films 515 (2007) 3380-3386. Silicon excess in atomic percentage and the refractive index of silicon oxide samples deposited at different flow ratios (R) are shown in the Table below. A 50% Si-excess above stoichiometric $SiO_2$ translates to a silicon oxide material characterized as $SiO_{2-x}$ where x=0.67.

| Flow ratio (R) | Si-excess (atomic %) | Refraction index |
|---|---|---|
| 2.20 | 50.0 | 2.253 |
| 3.60 | 37.0 | 1.939 |
| 5.50 | 25 | |

Moreover, thermally grown oxides derived from polysilicon or amorphous silicon comprising layers can be distinguished from thermally grown oxides derived from single crystal Si comprising layers, such as epitaxial layers according to embodiments of the invention, based on surface roughness. For example, a high-resolution transmission electron microscope (TEM) image can be used to evidence such differences.

As known in the art, a deposited amorphous silicon layer will change to a polycrystalline layer in the oxidation furnace prior to being oxidized due to the high-temperature of the oxidation process (e.g. >800° C.). The grain size distribution of the polysilicon layer for either the deposited amorphous or polysilicon case depends on the thermal processes received, but is typically primarily in the tens of nanometers range. Since the crystal orientations at different locations in the polysilicon layer are different, the resulting oxide thickness will vary from regions derived from one grain to adjacent regions derived from another grain. The oxidation of the grains of varying crystal orientation in the polysilicon generally results in local area variations (i.e. over dimensions of the size of individual grains) of thermally grown oxide thickness of at least 10 angstroms for oxide thickness at least several hundred angstroms thick within localized regions, resulting in significant surface roughness. For example, polycrystalline silicon grains are generally columnar in shape. Thus, there are likely to be several instances of oxide thickness changing by greater than 100 angstroms, and the top surface of the oxide will not faithfully following the contour of the bottom surface. In a typical embodiment, the local area variation may generally be between 20 and 100 Angstroms.

In contrast, thermally grown oxides derived from single crystal Si comprising layers, such as epitaxial layers according to embodiments of the invention, do not have surface roughness resulting from varying grain orientations that, as described above, is characteristic of thermally grown oxides derived from polysilicon. Thermally grown oxides derived from single crystal Si comprising layers, such as epitaxial layers according to embodiments of the invention, will generally provide a surface that faithfully reproduces the contour of the underlying silicon surface to within about 2 to 3 angstroms.

Referring again to FIG. 1, step 105 comprises forming a patterned gate electrode layer over the gate dielectric, wherein the patterned gate electrode layer extends over the trench isolation/active area edges. Step 106 comprises completing fabrication of the IC, generally according to standard manufacturing procedures, such as completing fabrication of PMOS and NMOS devices including the steps of forming spacers, forming source/drain regions, siliciding, multi-layer metallization, and passivation. Replacement gate processing may also be included.

Figure 3A:
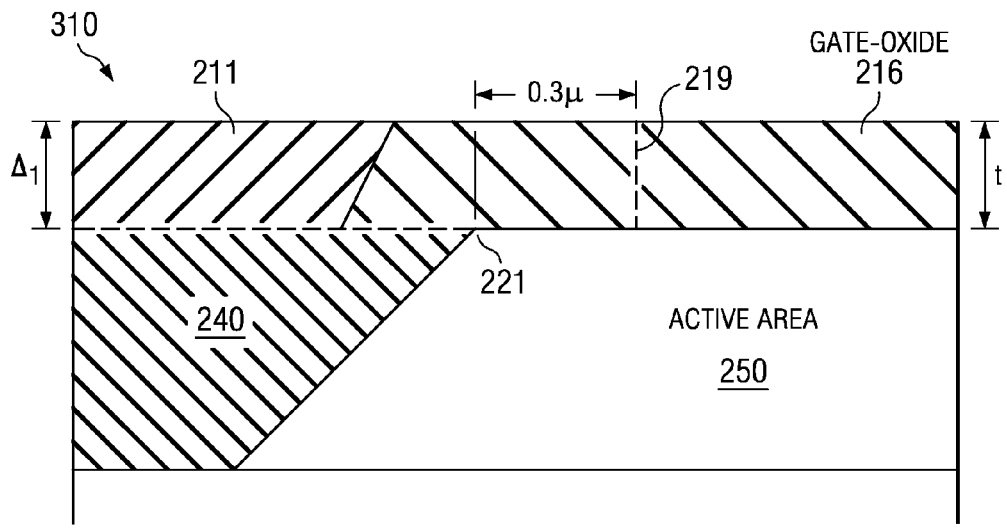
FIGS. 3A-B are cross-sectional depictions of the resulting layer topography and distinguishable topographical characteristics for devices according to embodiments of the invention for both selective epitaxial and non-selective epitaxial processing, as compared to the resulting topography from a conventional process flow shown in FIG. 3C.
Figure 3B:
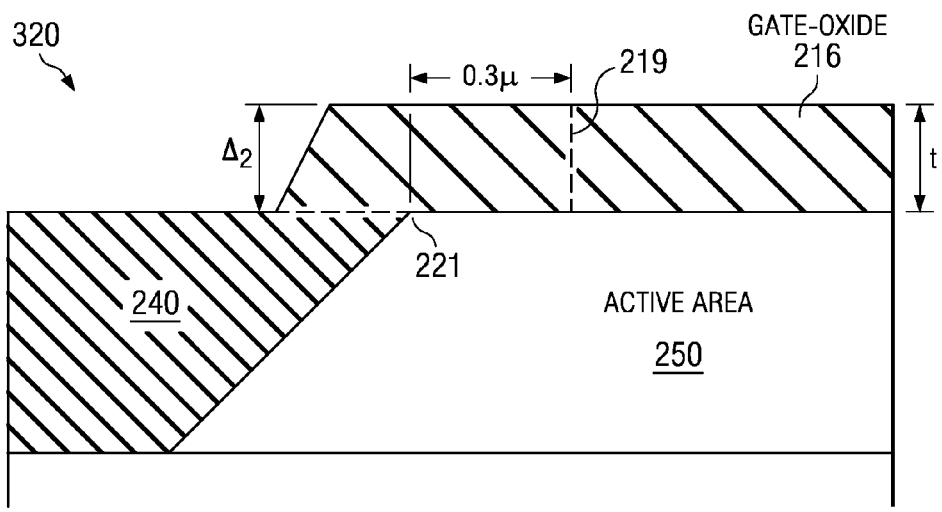
Figure 3C:
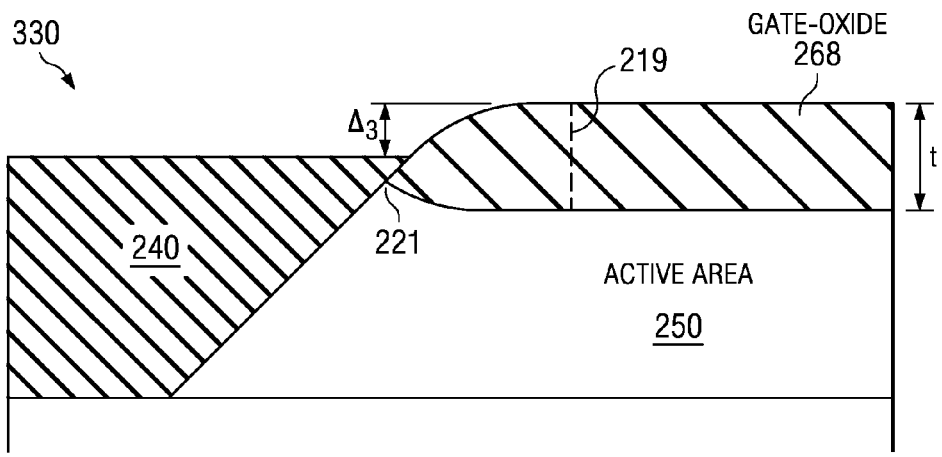

FIGS. 3A-B are cross-sectional depictions of the resulting layer topography evidencing distinguishable topographical characteristics for devices according to embodiments of the invention for both selective epitaxial and non-selective epitaxial processing, as compared to the resulting topography from a conventional process flow shown in FIG. 3C (prior art). Divots that may be present are not shown.

Cross section 310 shown in FIG. 3A shows a cross sectional depiction following non-selective epitaxial deposition at step 103 and thermal oxidation at step 104 which is shown converting all of the epitaxial silicon 215 and polysilicon 210 layers into oxidized epitaxial silicon layer 216 (shown as the gate oxide) and oxidized polysilicon layer 211, respectively, both having a thickness "t". Thickness "t" is generally 500 to 5,000 Angstroms, but can be above or below this range. $\Delta_1$ indicates the height difference between the upper oxide surface at the highest point over the trench isolation 240 (the height being essentially a constant thickness over trench isolation 240) and the top surface of trench isolation 240 (generally a deposited dielectric, such as a deposited oxide) which is essentially coplanar with the lower surface of the oxidized epitaxial silicon layer/gate oxide 216. $\Delta_1 > 0$ and is generally approximately equal to 1.5 times the thickness of the epitaxial silicon layer deposited at step 103 (and converted to thermal oxide at step 104). It can also be seen that the thickness of the oxidized epitaxial silicon layer/gate oxide 216 over the trench isolation/active area edge 221 (referred to herein as the "first thickness") is >95%, of a thickness of gate oxide layer 216 over the surface of active area 250 away from the edge (referred to herein as the "second thickness"), such as at a reference position 219 over the active area 250 that is 0.3 μm away from the trench isolation active area edge.

Cross section 320 shown in FIG. 3B shows a cross-sectional depiction following selective epitaxial deposition at step 103' and thermal oxidation at step 104' which is shown with all of the epitaxial silicon 215 converted into thermally grown gate oxide layer 216, having a thickness "t". As noted above, "t" is generally 500 to 5,000 Angstroms, but can be above or below this range. $\Delta_2$ indicates the height difference between the upper oxide surface at the highest point over the trench isolation 240 (the upper oxide surface being proximate to the trench edge 221 as shown) and the top surface of trench isolation 240 (generally a deposited dielectric, such as a deposited oxide) which is essentially coplanar with the lower surface of the oxidized epitaxial silicon layer/gate oxide 216. $\Delta_2$>0 and, as with the non-selective deposition embodiment, is generally approximately equal to 1.5 times the thickness of the epitaxial silicon layer deposited at step 103 (and converted to thermal oxide at step 104) It can also be seen that the first thickness of the thermally grown gate oxide 216 over the trench isolation active area edge 221 is >95% of the second thickness of gate dielectric layer over the surface of active area 250 away from the edge, such as at a reference position 219 that is 0.3 μm away from the trench isolation active area edge.

Cross section 330 shown in FIG. 3C (prior art) shows a cross-sectional depiction following thermal gate oxidation showing resulting topography from a conventional process flow. As with cross sections 310 and 320 shown in FIGS. 3A and 3B, respectively, the thickness of the thermally grown gate oxide, shown as gate oxide 268, is "t". There is no gate oxide 268 over the surface of the trench isolation 240. $\Delta_3$ indicates the height difference between the upper oxide surface at the highest point over the trench isolation 240 and top surface of trench isolation 240 (generally a deposited dielectric, such as a deposited oxide), which is shown as ≈0. It can also be seen that the thickness of the gate oxide 268 over the trench isolation active area edge 221 is <60% of a thickness of gate dielectric layer 268 over the surface of active area 250 away from the edge, such as at a reference position 219 that is 0.3 μm away from the trench isolation active area edge.

Figure 4:
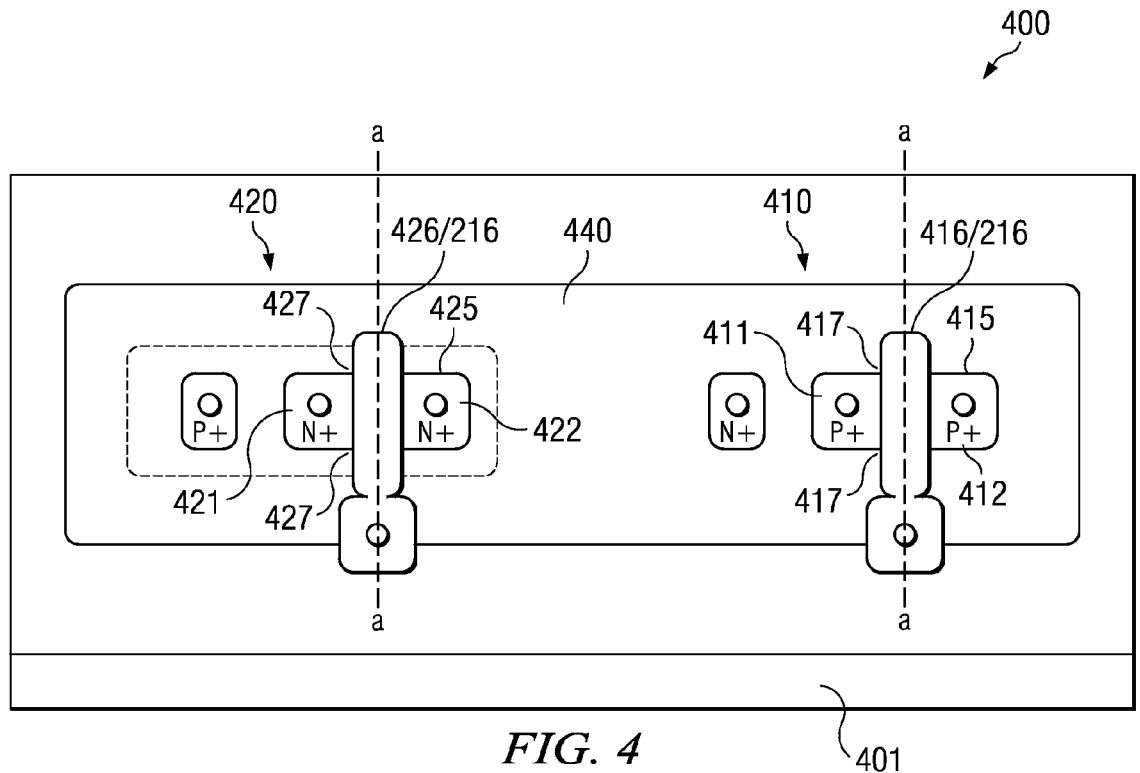
FIG. 4 shows a top view depiction of an IC comprising a PMOS and an NMOS device, each having an essentially constant gate oxide thickness and thus no measurable gate dielectric thinning at the trench/active area edges, according to an embodiment of the invention.

FIG. 4 shows a top view depiction of an IC 400 comprising a PMOS device 410 and an NMOS device 420, each having an essentially constant thermally grown gate oxide thickness and thus no measurable (<5%, such as 0%) gate dielectric thinning at the trench/active area edge, according to an embodiment of the invention. IC 400 comprises a substrate 401 having a silicon comprising surface. IC 400 includes a plurality of dielectric filled trench isolation regions 440 formed in the substrate. The silicon comprising surface forms trench isolation active area edges along its periphery with the active areas, such as active area 415 for the gate electrode and S/D regions 411 and 412 for PMOS device 410 and active area 425 for NMOS device 420. A patterned gate stack comprising a patterned gate electrode 416 for PMOS device 410 and gate electrode 426 for NMOS device 420, on a gate dielectric layer (shown as gate oxide 216 in FIGS. 2A-D and 3A-B) comprising primarily (and generally entirely) thermally grown silicon oxide is formed on the silicon comprising surface of substrate 401. The patterned gate electrodes 416 and 426 extend over the trench isolation active area edges shown as edge 417 for PMOS device 410 and edge 427 for NMOS device 420.

PMOS device 410 includes source region 411 and drain region 412 on opposite sides of the gate stack 416/216, while NMOS device 420 includes source region 421 and drain region 422 on opposite sides of the gate stack 426/216. The first thickness of the thermally grown silicon oxide comprising gate dielectric layer 216 over the trench isolation active area edges 417 and 427 is generally at least 95% of a second thickness of gate dielectric layer 216 over the silicon comprising surface 0.3 μm away from the trench isolation active area edges 417/427 as described above relative to FIGS. 3A-C, which correspond to trench isolation active area edges along the cut shown along the line a-a shown in FIG. 4. The first and second thickness are both generally from 500 to 5,000 Angstroms.

Figure 5:
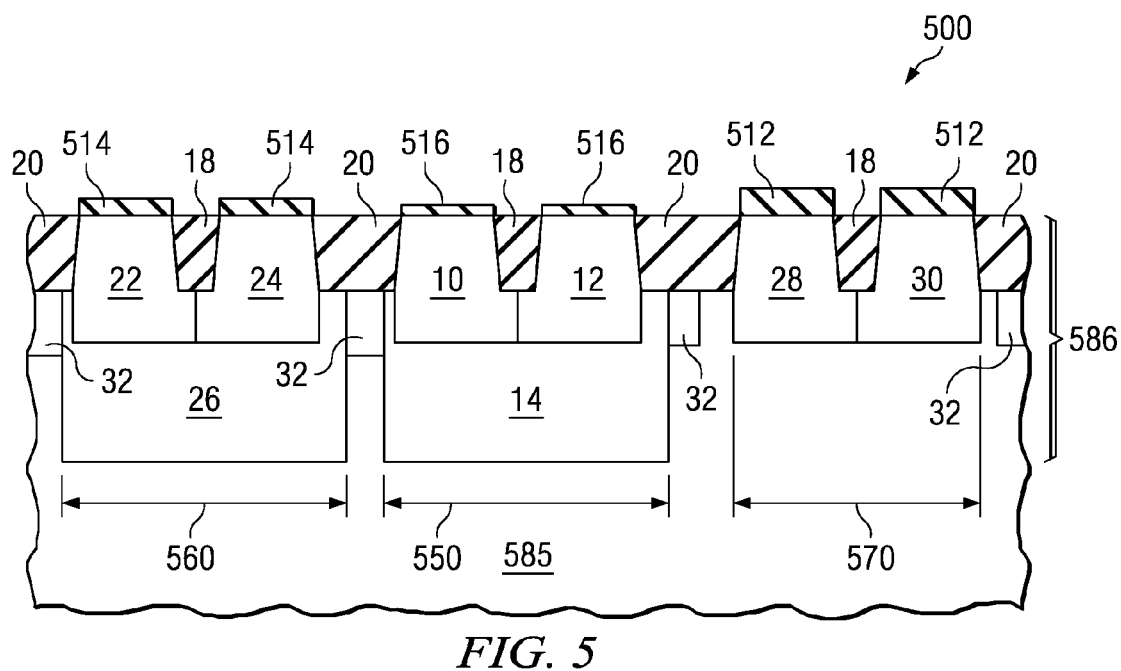
FIG. 5 is a simplified cross-sectional view of a triple gate dielectric (TGD) device according to an embodiment of the invention.

FIG. 5 is a simplified cross sectional view of a triple gate dielectric (TGD) device 500 according to an embodiment of the invention. TGD device 500 includes a substrate 585 having semiconductor regions of the first kind 550, semiconductor regions of the second kind 560, and semiconductor regions of the third kind 570 formed therein. Semiconductor regions of the first kind 550 are generally low voltage regions over which devices with thin gate dielectrics 516 (e.g. 15 to 100 Angstroms thick) are formed, semiconductor regions of the second kind 560 are intermediate voltage regions over which devices with gate dielectrics of intermediate thickness (e.g. 50 to 250 Angstroms) 514 are formed and semiconductor regions of the third kind are high voltage regions over which devices with thick gate dielectrics (e.g. 500 to 5,000 Angstroms thick).

Correspondingly, there is a low threshold voltage for MOSFET in semiconductor regions of the first kind, an intermediate threshold voltage for MOSFET in semiconductor regions of the second kind and a high threshold voltage for MOSFET in semiconductor regions of the third kind. Gate electrodes are not shown.

In the semiconductor regions of the first kind 550 there is an n-well 10 and a p-well 12, which are formed in a deep n-well 14 that is formed in a p-surface region 586 of substrate 585. An isolation region 18, which is generally a trench isolation region, electrically isolates the n-well 10 from the p-well 12. FIG. 5 depicts examples of what could constitute semiconductor regions of the first kind, which could contain any number of n-type or p-type semiconductor regions. The semiconductor regions can be any kind of semiconductor region and not necessarily wells. The semiconductor regions need not be formed in a deep n-well that is formed in a p-substrate, but could for example be formed in a deep p-well that is formed in an n-substrate.

Semiconductor region of the second kind 560 includes an n-well 22 and a p-well 24, which are formed in a deep n-well 26 that is formed in a p surface region 586 of substrate 585. An isolation region 18, which is generally a trench isolation region, separates the n-well 22 from the p-well 24. FIG. 5 depicts examples of what could constitute the semiconductor region of the second kind, which could contain any number of n-type or p-type semiconductor regions. The semiconductor regions can be any kind of semiconductor region and not necessarily wells. The semiconductor regions need not be formed in a deep n-well that is formed in a p-substrate, but could for example be formed in a deep p-well that is formed in an n-substrate.

In the same way, semiconductor regions of the third kind 570 includes an n-well 28 and a p-well 30, which are formed in a p-layer 586. An isolation region, 18, which is generally a trench isolation region, separates the n-well 28 from the p-well 30. FIG. 5 depicts examples of what could constitute semiconductor regions of the third kind, which could contain any number of n-type or p-type semiconductor regions. The semiconductor regions can be any kind of semiconductor region and not necessarily wells and they could be formed in an n-substrate.

Isolation regions 20 are shown in FIG. 5 separating regions of different kinds 550, 560 and 570. These isolation regions can be trench isolation regions that are disposed over field implant regions 32, which can be added as known in the art to enhance the isolation.

Embodiments of the invention can be integrated into a variety of process flows to form a variety of ICs and related products. Exemplary devices and products include ICs including high voltage devices that provide gate to body breakdown voltages >25 volts that generally require gate dielectrics having a thickness between 500 and 5,000 Angstroms, as well as double and triple gate comprising ICs that include such high voltage devices.

The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS processes.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method of fabricating an integrated circuit device including a plurality of Metal Oxide Semiconductor (MOS) transistors, comprising:

providing a substrate having a silicon comprising surface;

forming a plurality of dielectric filled trench isolation regions in said substrate, wherein said silicon comprising surface forms trench isolation active area edges along its periphery with said trench isolation regions;

depositing an epitaxial silicon comprising layer, said epitaxial comprising silicon layer being deposited over said silicon comprising surface and including depositing silicon extending laterally for a distance over at least one of said trench isolation active area edges onto at least one of said trench isolation regions;

oxidizing said epitaxial comprising silicon layer to convert at least a thickness portion of said epitaxial comprising silicon layer into a thermally grown silicon oxide layer, wherein said thermally grown silicon oxide layer extends laterally over said at least one of said trench isolation active area edges and provides at least a portion of a gate dielectric layer for at least one of said plurality of MOS transistors; and forming a patterned gate electrode layer over said at least said portion of said gate dielectric layer, wherein said patterned gate electrode layer extends laterally over said at least one of said trench isolation active area edges.

2. The method of claim 1, wherein a thickness of said gate dielectric layer over said silicon comprising surface away from said trench isolation active area edges is from 500 to 5,000 Angstroms.

3. The method of claim 1, wherein said oxidizing converts all of said epitaxial comprising silicon layer to said thermally grown silicon oxide layer.

4. The method of claim 1, wherein said depositing step comprises a non-selective silicon deposition, wherein said deposition deposits said epitaxial comprising silicon layer on said silicon comprising surface and over said at least one of said trench isolation regions for a portion defined by said laterally extending distance, and deposits a polysilicon comprising layer over a remainder of said trench isolation regions.

5. The method of claim 1, wherein a thickness of said thermally grown silicon oxide layer over said silicon comprising surface away from said trench isolation active area edges is from 1,000 to 5,000 Angstroms, and a thickness of said epitaxial silicon comprising layer as deposited by said deposition is from 25 to 55% of said thickness of said silicon oxide layer.

6. The method of claim 1, wherein said depositing step comprises a selective epitaxial deposition, wherein silicon is not deposited on said trench isolation regions except for a portion of said epitaxial comprising silicon layer having a facet extending from said epitaxial comprising silicon layer over said trench isolation active area edge, said facet having an orientation depending on an orientation of said silicon comprising surface on said trench isolation regions proximate to said trench edges.

7. The method of claim 1, wherein said forming said plurality of dielectric filled trench isolation regions further comprises hard mask layer pullback processing.

8. The method of claim 1, wherein the distance is at least 300 Angstroms.

9. The method of claim 2, wherein a first thickness of said gate dielectric layer over said trench isolation active area edges is at least 95% of a second thickness of said gate dielectric layer over said silicon comprising surface 0.3 μm away from said trench isolation active area edges.

10. The method of claim 2, wherein a first thickness of said gate dielectric layer is at least 100% of a second thickness of said silicon oxide layer over said gate dielectric layer over said silicon comprising surface 0.3 μm away from said trench isolation active area edges.

11. The method of claim 4, wherein said depositing step comprises a first deposition comprising a selective first epitaxial deposition portion and a second deposition after said first deposition comprising the non-selective silicon deposition including a second epitaxial deposition portion.

12. A method of fabricating an integrated circuit device, comprising:
   providing a substrate having a surface comprising silicon;
   forming a dielectric filled trench isolation region in the substrate to isolate and define an active area in the substrate surface, wherein an edge is formed at a transition between the trench isolation region and the active area;
   after forming the dielectric filled trench isolation region, depositing a layer of silicon over the substrate surface including growing an epitaxial silicon layer on the silicon comprising surface in the active area and depositing silicon extending laterally for a distance from said active area over the edge onto the trench isolation region; and
   oxidizing the epitaxially grown silicon layer to convert at least a thickness portion of the epitaxially grown silicon layer into a thermally grown silicon oxide layer, wherein the thermally grown silicon oxide layer provides at least a portion of a gate dielectric including a part extending laterally over the edge onto the trench isolation region.

13. The method of claim 12, wherein depositing the layer of silicon is done selectively, and does not include depositing silicon on other parts of the dielectric filled trench isolation region other than for the distance over the edge.

14. The method of claim 12, wherein depositing the layer of silicon also includes depositing silicon on at least some other parts of the dielectric filled trench isolation region other than for the distance over the edge; and wherein oxidizing the epitaxially grown silicon layer also includes oxidizing the silicon deposited on the at least some other parts of the dielectric filled trench isolation region.

15. The method of claim 14, wherein oxidizing the silicon deposited on the at least some other parts of the dielectric filled trench isolation region oxidizes all of the silicon deposited on the at least some other parts of the dielectric filled trench isolation region.

16. The method of claim 12, further comprising removing pad oxide following forming the trench isolation region and prior to depositing the layer of silicon.

17. The method of claim 12, further comprising forming a gate electrode over the gate dielectric, including a portion extending over the part of the gate dielectric over the edge.

18. The method of claim 12, wherein the distance is at least 300 Angstroms.

19. A method of fabricating an integrated circuit device, comprising:
   providing a substrate having a surface comprising silicon;
   forming a dielectric filled trench isolation region in the substrate to isolate and define an active area in the substrate surface, wherein an edge is formed at a transition between the trench isolation region and the active area;
   after forming the dielectric filled trench isolation region, depositing a layer of silicon over the substrate surface and over the trench filled isolation region, including growing an epitaxial silicon layer on the silicon comprising surface in the active area and extending laterally for a distance over the edge onto a part of the trench isolation region, and depositing a polysilicon layer onto other parts of the trench isolation region; and
   oxidizing the epitaxially grown silicon layer and the polysilicon layer to convert at least a thickness portion of the epitaxially grown silicon layer and all of the polysilicon layer into a thermally grown silicon oxide layer, wherein the thermally grown silicon oxide layer provides at least a portion of a gate dielectric.

20. The method of claim 19, wherein oxidizing the epitaxially grown silicon layer converts all of the epitaxially grown silicon layer into the thermally grown silicon oxide layer.

21. The method of claim 19, wherein the converted thickness portion provides at least 50% of a thickness of a gate oxide layer.

* * * * *